US012676602B2

(12) United States Patent
Kawase et al.

(10) Patent No.: US 12,676,602 B2
(45) Date of Patent: Jul. 7, 2026

(54) INPUT CIRCUIT AND SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Eriko Kawase, Tokyo (JP); Akio Ogura, Yokohama Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 0 days.

(21) Appl. No.: 18/818,352

(22) Filed: Aug. 28, 2024

(65) Prior Publication Data

US 2025/0300655 A1     Sep. 25, 2025

(30) Foreign Application Priority Data

Mar. 19, 2024   (JP) ................................. 2024-043175

(51) Int. Cl.
*H03K 5/24*          (2006.01)
*G01R 19/00*         (2006.01)

(52) U.S. Cl.
CPC ....... *H03K 5/2472* (2013.01); *G01R 19/0038* (2013.01)

(58) Field of Classification Search
CPC ..... G01R 19/0038; H03K 5/24; H03K 5/2472
USPC ...................................................... 327/63, 65
See application file for complete search history.

(56) References Cited

U.S. PATENT DOCUMENTS

| | | | |
|---|---|---|---|
| 7,049,889 B2 | 5/2006 | Kalb | |
| 9,130,521 B2 | 9/2015 | Iwamoto | |
| 2005/0218980 A1 | 10/2005 | Kalb | |
| 2022/0166391 A1* | 5/2022 | Hong ...................... H03F 3/303 |
| 2024/0088874 A1* | 3/2024 | Chen ....................... H03K 5/22 |

FOREIGN PATENT DOCUMENTS

| | | |
|---|---|---|
| JP | 2007-531459 A | 11/2007 |
| JP | 4638481 B2 | 2/2011 |
| JP | 2012-039548 A | 2/2012 |
| JP | 6217115 B2 | 10/2017 |

* cited by examiner

*Primary Examiner* — William Hernandez
(74) *Attorney, Agent, or Firm* — Kim & Stewart LLP

(57) ABSTRACT

According to one embodiment, an input circuit is connected to an output circuit that outputs an output value based on a first voltage and a second voltage, to which the first voltage and the second voltage are applied. The input circuit includes: a first differential transistor section including a plurality of first transistors connected in parallel with each other; a second differential transistor section including a plurality of second transistors connected in parallel with each other; and a selectable cutoff section capable of selecting a state in which a current is cut off. The output circuit includes a first current path section and a second current path section arranged in parallel with each other between ground and a power supply voltage wiring. The first differential transistor section and the second differential transistor section are arranged in parallel with each other between the ground and the power supply voltage wiring.

4 Claims, 8 Drawing Sheets

INPUT CIRCUIT AND SEMICONDUCTOR DEVICE

CROSS-REFERENCE TO RELATED APPLICATION(S)

This application claims priority to Japanese Patent Application No. 2024-043175, filed on Mar. 19, 2024, the contents of which are incorporated herein by reference.

FIELD

Embodiments of the present invention relate to an input circuit and a semiconductor device.

BACKGROUND

Circuits such as comparator circuits that perform output based on the difference between two input voltages are known. In such circuits, the output value changes according to the change in the two input voltages. However, due to the variation in impedance of the elements that constitute the circuit, the change in the output value may deviate from the change in the two input voltages, that is, an input offset voltage may occur.

As a trimming technique for adjusting such an input offset voltage, for example, adding a current source can increase or decrease the amount of current flow through the circuit. However, in this case, since the amount of current changes, the time required to charge the transistors included in the circuit may vary, and the responsiveness of the circuit may be deteriorated.

DETAILED DESCRIPTION

According to an aspect, an input circuit is connected to an output circuit that outputs an output value based on a first voltage and a second voltage, to which the first voltage and the second voltage are applied. The input circuit includes: a first differential transistor section including a plurality of first transistors connected in parallel with each other; a second differential transistor section including a plurality of second transistors connected in parallel with each other; and a selectable cutoff section capable of selecting a state in which a current is cut off. The output circuit includes a first current path section and a second current path section arranged in parallel with each other between ground and a power supply voltage wiring to which a power supply voltage is applied. The first differential transistor section and the second differential transistor section are arranged in parallel with each other between the ground and the power supply voltage wiring. The first voltage is applied to the drive terminal of the plurality of first transistors. The second voltage is applied to the drive terminal of the plurality of second transistors. A first terminal of the plurality of first transistors is connected to the first current path section. A first terminal of the plurality of second transistors is connected to the second current path section. A second terminal of the plurality of first transistors and a second terminal of the plurality of second transistors are connected to each other. The selectable cutoff section is connected in series to one of the plurality of first transistors or one of the plurality of second transistors.

The input circuit and the semiconductor device of the embodiment will be described below with reference to the drawings.

First Embodiment

Figure 1:
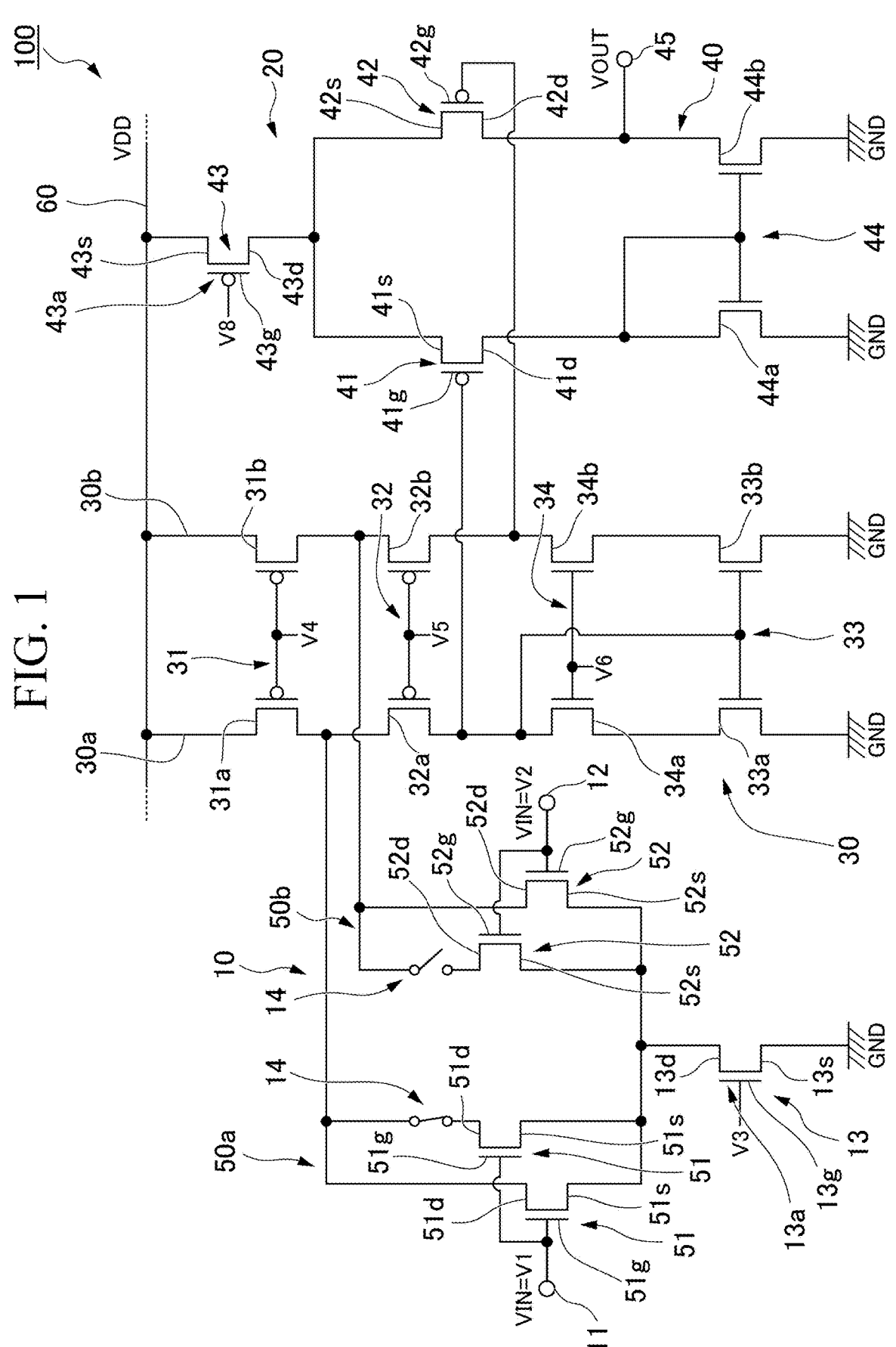
FIG. 1 is a circuit diagram showing a semiconductor device of a first embodiment.

FIG. 1 is a circuit diagram showing a semiconductor device 100 of the first embodiment. The semiconductor device 100 of the first embodiment shown in FIG. 1 is a comparator. The semiconductor device 100 outputs one output voltage VOUT as an output value for two input voltages VIN, a first voltage V1 and a second voltage V2. As shown in FIG. 1, the semiconductor device 100 includes an input circuit 10 and an output circuit 20.

The input circuit 10 is connected to the output circuit 20. The first voltage V1 and the second voltage V2 are applied to the input circuit 10. The input circuit 10 includes a first input terminal 11, a second input terminal 12, a first differential transistor section 50a, a second differential transistor section 50b, and a current source 13. The first voltage V1 is applied to the first input terminal 11 as the input voltage VIN. The second voltage V2 is applied to the second input terminal 12 as an input voltage VIN. The first differential transistor section 50a and the second differential transistor section 50b form a differential pair. The first differential transistor section 50a and the second differential transistor section 50b are arranged in parallel between a power supply voltage wiring 60 to which a power supply voltage VDD is applied and ground GND. The ground GND has a reference potential. The reference potential is, for example, 0 V. The reference potential is not particularly limited and may be a potential other than 0 V. The voltages described in each embodiment are voltages based on the reference potential of the ground GND. In other words, the voltage of the ground GND is 0 V. The first differential transistor section 50a has a plurality of first transistors 51. The second differential transistor section 50b has a plurality of second transistors 52.

In the first embodiment, the plurality of first transistors 51 and the plurality of second transistors 52 are field effect transistors (FETs). More specifically, the first transistors 51 and the second transistors 52 are N-channel MOSFETs (Metal-Oxide-Semiconductor Field-Effect Transistors). The first transistors 51 are connected in parallel to each other. The first input terminal 11 is connected to each of the gate terminals 51g of the first transistors 51. As a result, a first voltage V1 is applied to the gate terminals 51g of the first transistors 51. The second transistors 52 are connected in parallel to each other. The second input terminal 12 is connected to each of the gate terminals 52g of the second transistors 52. As a result, a second voltage V2 is applied to the gate terminals 52*g* of the second transistors 52.

The drain terminals 51*d* of the first transistors 51 are connected to a first current path section 30*a* of the output circuit 20, which will be described later. The drain terminals 52*d* of the second transistors 52 are connected to a second current path section 30*b* of the output circuit 20, which will be described later. The source terminals 51*s* of the first transistors 51 and the source terminals 52*s* of the second transistors 52 are connected to each other. In the first embodiment, two first transistors 51 and two second transistors 52 are provided.

The ratio W/L of the channel width W to the channel length L of the first transistor 51 and the ratio W/L of the channel width W to the channel length L of the second transistor 52 are greater than the ratios W/L of the channel width W to the channel length L of the other transistors in the semiconductor device 100.

In this disclosure, the gate terminal of a field effect transistor corresponds to a "drive terminal". The drive terminal of a transistor is a terminal to which a voltage is applied to drive the transistor. In the first embodiment, the drain terminal 51*d* of the first transistor 51 and the drain terminal 52*d* of the second transistor 52 correspond to a "first terminal". The source terminal 51*s* of the first transistor 51 and the source terminal 52*s* of the second transistor 52 correspond to a "second terminal".

The current source 13 is configured to pass a constant current. In the first embodiment, the current source 13 is configured by one transistor 13*a*. The current source 13 is not particularly limited as long as it is configured to pass a constant current, and may include, for example, a plurality of transistors. In the first embodiment, the transistor 13*a* is a field effect transistor. More specifically, the transistor 13*a* is an N-channel MOSFET. The drain terminal 13*d* of the transistor 13*a* is connected to the source terminals 51*s* of the plurality of first transistors 51 and the source terminals 52*s* of the plurality of second transistors 52. The source terminal 13*s* of the transistor 13*a* is connected to the ground GND.

A predetermined voltage V3 is applied to the gate terminal 13*g* of the transistor 13*a*. The application of the predetermined voltage V3 to the gate terminal 13*g* turns the transistor 13*a* ON. The value of the current that can flow through the transistor 13*a* is determined according to the magnitude of the predetermined voltage V3. Therefore, by applying a predetermined voltage V3 to the gate terminal 13*g*, the transistor 13*a* functions as a current source 13 that supplies a constant current.

The input circuit 10 includes a selectable cutoff section 14. The selectable cutoff section 14 is a portion that can select a state in which the current is cut off. The selectable cutoff section 14 is connected in series to at least one of the plurality of first transistors 51 and the plurality of second transistors 52. In the first embodiment, the selectable cutoff section 14 is connected in series to each of one first transistor 51 and one second transistor 52. The selectable cutoff section 14 connected in series to the first transistor 51 is connected to the drain terminal 51*d* of the first transistor 51. The selectable cutoff section 14 connected in series to the second transistor 52 is connected to the drain terminal 52*d* of the second transistor 52. The selectable cutoff section 14 connected in series to the first transistor 51 may be connected to the source terminal 51*s* of the first transistor 51. The selectable cutoff section 14 connected in series to the second transistor 52 may be connected to the source terminal 52*s* of the second transistor 52.

The selectable cutoff section 14 is in one of two states: a state in which it allows current to flow and a state in which it cuts off current. In the example of FIG. 1, the selectable cutoff section 14 connected in series to the first transistor 51 is in a state in which it allows current to flow. The selectable cutoff section 14 connected in series to the second transistor 52 is in a state in which it cuts off current. In the following description, the state in which the selectable cutoff section 14 allows current to flow is called the "conducting state", and the state in which the selectable cutoff section 14 cuts off current is called the "cutoff state".

In the first embodiment, the selectable cutoff section 14 is a fuse. The state in which the selectable cutoff section 14, which is a fuse, is not cut off is the conducting state. The state in which the selectable cutoff section 14, which is a fuse, is cut off is the cutoff state. During manufacturing of the input circuit 10, the selectable cutoff section 14, which is a fuse, is either left uncut or cut off, and the selectable cutoff section 14 is set to either a conductive state or a cutoff state.

The output circuit 20 is connected to the input circuit 10. The output circuit 20 outputs an output voltage VOUT as an output value based on a first voltage V1 and a second voltage V2. In the first embodiment, the output circuit 20 has a first amplifier circuit section 30 and a second amplifier circuit section 40.

The first amplifier circuit section 30 is connected to the input circuit 10. The first amplifier circuit section 30 amplifies the voltage difference between the first voltage V1 and the second voltage V2 input to the input circuit 10, and outputs the amplified voltage difference to the second amplifier circuit section 40. The first amplifier circuit section 30 has a first current path section 30*a*, a second current path section 30*b*, a current source circuit section 31, a first auxiliary circuit section 32, a first current mirror circuit section 33, and a second auxiliary circuit section 34.

The first current path section 30*a* and the second current path section 30*b* are arranged in parallel between a power supply voltage wiring 60 to which a power supply voltage VDD is applied and ground GND. One end of the first current path section 30*a* and one end of the second current path section 30*b* are connected to the power supply voltage wiring 60. The other end of the first current path section 30*a* and the other end of the second current path section 30*b* are connected to ground GND. In the first embodiment, the first current path section 30*a* is configured by connecting a transistor 31*a*, a transistor 32*a*, a transistor 34*a*, and a transistor 33*a*, which will be described later, in series in this order between the power supply voltage wiring 60 and ground GND. In the first embodiment, the second current path section 30*b* is configured by connecting transistors 31*b*, 32*b*, 34*b*, and 33*b*, which will be described later, in series between the power supply voltage wiring 60 and ground GND in this order.

The current source circuit section 31 is a circuit configured to pass a constant current. In the first embodiment, the current source circuit section 31 is configured by a pair of transistors 31*a*, 31*b*. In the first embodiment, the pair of transistors 31*a*, 31*b* are field effect transistors. More specifically, the pair of transistors 31*a*, 31*b* are P-channel MOSFETs. The gate terminals of the pair of transistors 31*a*, 31*b* are connected to each other. The transistor 31*a* is provided in the first current path section 30*a*. The transistor 31*b* is provided in the second current path section 30*b*. The source terminals of the pair of transistors 31*a*, 31*b* are connected to the power supply voltage wiring 60. A predetermined voltage V4 is applied to the gate terminals of the pair of transistors 31a, 31b. This causes the pair of transistors 31a, 31b to be in the ON state. In the first embodiment, the pair of transistors 31a, 31b are transistors having the same parameters, such as the ratio W/L of the channel width W to the channel length L and have the same characteristics. Therefore, when the pair of transistors 31a, 31b are turned on, they function as current sources that pass currents of the same magnitude. The magnitude of the current passed by each of the pair of transistors 31a, 31b is the same as the magnitude of the current passed by the current source 13, for example. In other words, the total amount of current passed by the current source circuit section 31 is, for example, twice the amount of current passed by the current source 13. The magnitude of the current passed by the pair of transistors 31a, 31b may vary due to the variation in the characteristics of the pair of transistors 31a, 31b.

The first auxiliary circuit section 32 is a circuit that assists the current source circuit section 31. In the first embodiment, the first auxiliary circuit section 32 is composed of a pair of transistors 32a, 32b. In the first embodiment, the pair of transistors 32a and 32b are field effect transistors. More specifically, the pair of transistors 32a and 32b are P-channel MOSFETs. The gate terminals of the pair of transistors 32a and 32b are connected to each other. The transistor 32a is provided in the first current path section 30a. The transistor 32b is provided in the second current path section 30b. The source terminal of the transistor 32a is connected to the drain terminal of the transistor 31a. The source terminal of the transistor 32b is connected to the drain terminal of the transistor 31b. A predetermined voltage V5 is applied to the gate terminals of the pair of transistors 32a and 32b. This causes the pair of transistors 32a and 32b to be in an ON state. In the first embodiment, the pair of transistors 32a and 32b are transistors having the same parameters, such as the ratio W/L of the channel width W to the channel length L and have the same characteristics. Therefore, by applying the same predetermined voltage V5 to each of the gate terminals of the pair of transistors 32a and 32b, the voltages of the source terminals of the pair of transistors 32a and 32b become the same. This allows the voltages of the drain terminals of the pair of transistors 31a and 31b connected to the source terminals of the pair of transistors 32a and 32b to be the same. In this way, by stabilizing the voltages of the drain terminals of the pair of transistors 31a and 31b constituting the current source circuit section 31 to be the same voltage, it is easier to make the currents flowing through the pair of transistors 31a and 31b more stably the same in magnitude. The voltages of the source terminals of the pair of transistors 32a and 32b may vary due to variations in the characteristics of the pair of transistors 32a and 32b.

The first current mirror circuit section 33 is composed of a pair of transistors 33a and 33b. The first current mirror circuit section 33 is a circuit configured to pass currents of the same magnitude through each of the pair of transistors 33a and 33b. The second auxiliary circuit section 34 is composed of a pair of transistors 34a and 34b. The second auxiliary circuit section 34 is a circuit that assists the first current mirror circuit section 33.

In the first embodiment, the transistors 33a, 33b, 34a, and 34b are field effect transistors. More specifically, the transistors 33a, 33b, 34a, and 34b are N-channel MOSFETs. The transistors 33a and 34a are provided in the first current path section 30a. The transistors 33b and 34b are provided in the second current path section 30b. In the first embodiment, the pair of transistors 33a and 33b are transistors having the same parameters, such as the ratio W/L of the channel width W to the channel length L and have the same characteristics. In the first embodiment, the pair of transistors 34a and 34b are transistors having the same parameters, such as the ratio W/L of the channel width W to the channel length L and have the same characteristics.

The transistors 33a and 34a are connected in series. The drain terminal of the transistor 33a is connected to the source terminal of the transistor 34a of the second auxiliary circuit section 34. The source terminal of the transistor 33a is connected to ground GND. The drain terminal of the transistor 34a is connected to the drain terminal of the transistor 32a of the first auxiliary circuit section 32.

The transistors 33b and 34b are connected in series. The drain terminal of the transistor 33b is connected to the source terminal of the transistor 34b. The source terminal of the transistor 33b is connected to ground GND. The drain terminal of the transistor 34b is connected to the drain terminal of the transistor 32b of the first auxiliary circuit section 32.

The gate terminals of the pair of transistors 33a and 33b in the first current mirror circuit section 33 are connected to each other. The gate terminals of the pair of transistors 33a and 33b are connected to the drain terminal of the transistor 32a and the drain terminal of the transistor 34a. The gate terminals of the pair of transistors 34a and 34b in the second auxiliary circuit section 34 are connected to each other. A predetermined voltage V6 is applied to the gate terminals of the pair of transistors 34a and 34b. This causes the pair of transistors 34a and 34b to be in the ON state. Since the pair of transistors 34a and 34b have the same characteristics, the voltages of the source terminals of the pair of transistors 34a and 34b become the same as each other by applying the same predetermined voltage V6 to each of the gate terminals of the pair of transistors 34a and 34b. The voltages of the source terminals of the pair of transistors 34a and 34b may vary due to the variation in the characteristics of the pair of transistors 34a and 34b.

The first current mirror circuit section 33 is configured so that a current of the same magnitude as the current flowing through the transistor 33a provided in the first current path section 30a flows through the transistor 33b provided in the second current path section 30b by having the pair of transistors 33a and 33b have the same characteristics. In the first embodiment, the voltages of the source terminals of the pair of transistors 34a and 34b in the second auxiliary circuit section 34 are the same, so the voltages of the drain terminals of the pair of transistors 33a and 33b connected to the source terminals of the pair of transistors 34a and 34b are also the same. This allows the voltages of the drain terminals of the pair of transistors 33a and 33b to be stably made the same. Therefore, it is easy to stably make the magnitude of the current flowing through the transistor 33a and the magnitude of the current flowing through the transistor 33b the same. The magnitude of the current flowing through the pair of transistors 33a and 33b may vary due to variations in the characteristics of the pair of transistors 33a and 33b.

A portion of the first current path section 30a between the transistors 31a and 32a is connected to one end of the first differential transistor section 50a in the input circuit 10. More specifically, a portion of the first current path section 30a between the transistors 31a and 32a is connected to the drain terminals 51d of the first transistors 51 in the input circuit 10. The drain terminals 51d of the first transistors 51 are connected to the drain terminal of the transistor 31a in the current source circuit section 31 and the source terminal of the transistor 32a in the first auxiliary circuit section 32. In the first embodiment, the drain terminal 51d of one first transistor 51 is connected to the first current path section 30$a$ via the selectable cutoff section 14, which is in a conducting state.

A portion of the second current path section 30$b$ between the transistors 31$b$ and 32$b$ is connected to one end of the second differential transistor section 50$b$ in the input circuit 10. More specifically, the drain terminals 52$d$ of the second transistors 52 in the input circuit 10 are connected to the portion of the second current path section 30$b$ between the transistors 31$b$ and 32$b$. The drain terminals 52$d$ of the second transistors 52 are connected to the drain terminal of the transistor 31$b$ in the current source circuit section 31 and the source terminal of the transistor 32$b$ in the first auxiliary circuit section 32. In the first embodiment, the drain terminal 52$d$ of one second transistor 52 is connected to the second current path section 30$b$ via the selectable cutoff section 14, which is in an interrupted state. Therefore, the drain terminal 52$d$ of the one second transistor 52 and the second current path section 30$b$ are interrupted by the selectable cutoff section 14.

In the circuit disclosed herein, "another element is disposed between a certain element and another element" means that the other element is provided on the circuit between the certain element and the other element, from one to the other.

The second amplifier circuit section 40 is connected to the first amplifier circuit section 30. The second amplifier circuit section 40 outputs an output voltage VOUT as an output value. The second amplifier circuit section 40 has a current source 43, a third transistor 41, a fourth transistor 42, a second current mirror circuit section 44, and an output terminal 45.

The current source 43 is configured to pass a constant current. In the first embodiment, the current source 43 is configured by one transistor 43$a$. The current source 43 is not particularly limited as long as it is configured to pass a constant current, and may include, for example, a plurality of transistors. In the first embodiment, the transistor 43$a$ is a field effect transistor. More specifically, the transistor 43$a$ is a P-channel MOSFET. The source terminal 43$s$ of the transistor 43$a$ is connected to the power supply voltage wiring 60. A predetermined voltage V8 is applied to the gate terminal 43$g$ of the transistor 43$a$. This causes the transistor 43$a$ to be in an ON state, and it functions as a current source 43 that passes a constant current. The above-mentioned predetermined voltages V3, V4, V5, V6, and V8 are not particularly limited, and may be voltages of the same magnitude or voltages of different magnitudes.

The third transistor 41 and the fourth transistor 42 are arranged in parallel between the current source 43 and the second current mirror circuit section 44. The third transistor 41 and the fourth transistor 42 form a differential pair. In the first embodiment, the third transistor 41 and the fourth transistor 42 are field effect transistors. More specifically, the third transistor 41 and the fourth transistor 42 are P-channel MOSFETs. The source terminal 41$s$ of the third transistor 41 and the source terminal 42$s$ of the fourth transistor 42 are connected to each other. The source terminal 41$s$ of the third transistor 41 and the source terminal 42$s$ of the fourth transistor 42 are connected to the drain terminal 43$d$ of the transistor 43$a$ of the current source 43.

The gate terminal 41$g$ of the third transistor 41 is connected to the first current path section 30$a$. More specifically, the gate terminal 41$g$ of the third transistor 41 is connected to a portion of the first current path section 30$a$ between the transistor 32$a$ of the first auxiliary circuit section 32 and the transistor 34$a$ of the second auxiliary circuit section 34. The gate terminal 41$g$ of the third transistor 41 is connected to the drain terminal of the transistor 32$a$ and the drain terminal of the transistor 34$a$.

The gate terminal 42$g$ of the fourth transistor 42 is connected to the second current path section 30$b$. More specifically, the gate terminal 42$g$ of the fourth transistor 42 is connected to a portion of the second current path section 30$b$ between the transistor 32$b$ of the first auxiliary circuit section 32 and the transistor 34$b$ of the second auxiliary circuit section 34. The gate terminal 42$g$ of the fourth transistor 42 is connected to the drain terminal of the transistor 32$b$ and the drain terminal of the transistor 34$b$.

In the first embodiment, the second current mirror circuit section 44 is composed of a pair of transistors 44$a$ and 44$b$. In the first embodiment, the pair of transistors 44$a$ and 44$b$ are field effect transistors. More specifically, the pair of transistors 44$a$ and 44$b$ are N-channel MOSFETs. The drain terminal of the transistor 44$a$ is connected to the drain terminal 41$d$ of the third transistor 41. The source terminal of the transistor 44$a$ is connected to the ground GND. The drain terminal of the transistor 44$b$ is connected to the drain terminal 42$d$ of the fourth transistor 42. The source terminal of the transistor 44$b$ is connected to the ground GND. The gate terminals of the pair of transistors 44$a$ and 44$b$ are connected to each other. The gate terminals of the pair of transistors 44$a$ and 44$b$ are connected to the drain terminal of the transistor 44$a$ and the drain terminal 41$d$ of the third transistor 41. The second current mirror circuit section 44 is a circuit that attempts to pass a current of the same magnitude to the transistor 44$b$ connected in series to the fourth transistor 42 as the current flowing through the transistor 44$a$ connected in series to the third transistor 41.

The output terminal 45 is a terminal from which the output voltage VOUT is output as an output value. The output terminal 45 is connected to the drain terminal 42$d$ of the fourth transistor 42 and the drain terminal of the transistor 44$b$ in the second current mirror circuit section 44.

Figure 2:
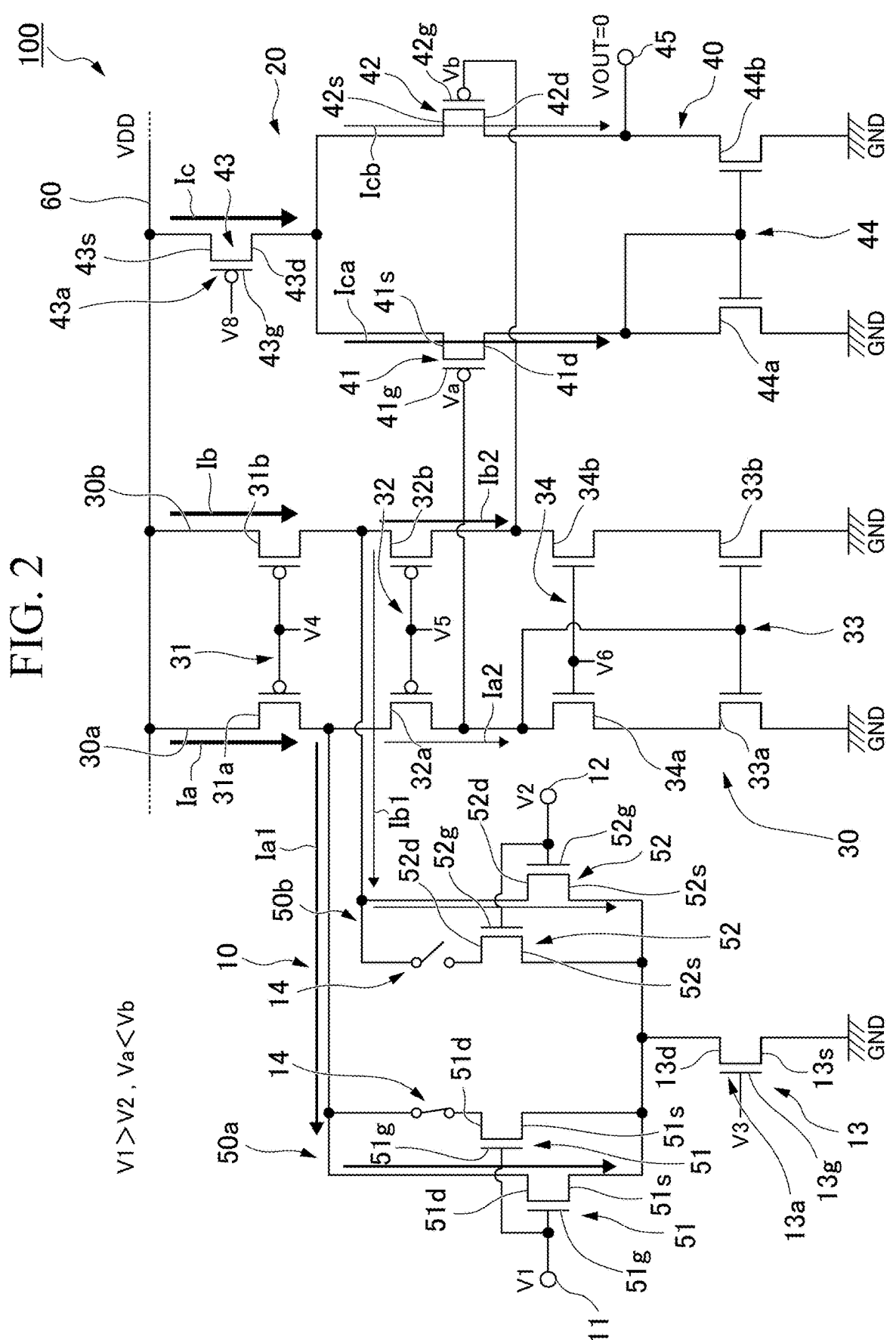
FIG. 2 is a circuit diagram showing an example of the operation of the semiconductor device of the first embodiment.
Figure 3:
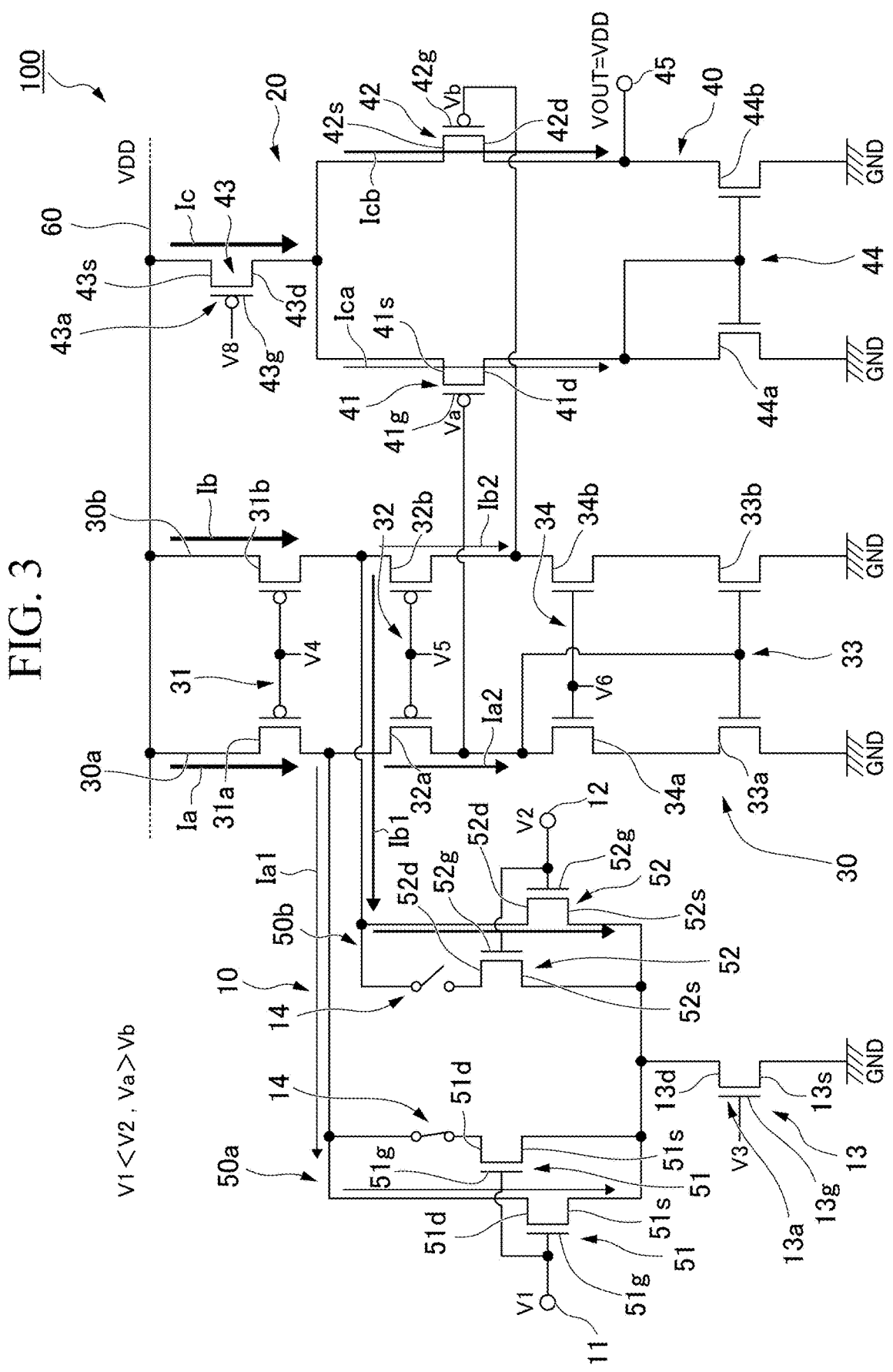
FIG. 3 is a circuit diagram showing another example of the operation of the semiconductor device of the first embodiment.

Next, the operation of the semiconductor device 100 will be described. FIG. 2 is a circuit diagram showing an example of the operation of the semiconductor device 100. FIG. 3 is a circuit diagram showing another example of the operation of the semiconductor device 100. FIG. 2 shows a case where the first voltage V1 is higher than the second voltage V2. FIG. 3 shows a case where the first voltage V1 is lower than the second voltage V2.

As shown in FIGS. 2 and 3, when the first voltage V1 is applied to the gate terminal 51$g$ of each first transistor 51 and the second voltage V2 is applied to the gate terminal 52$g$ of each second transistor 52, each of the first transistors 51 and the second transistors 52 that are not connected to the selectable cutoff section 14 is turned on and a current can flow. Each of the first transistors 51 and the second transistors 52 that are not connected to the selectable cutoff section 14 is normally driven in a non-saturation region. When each of the first transistors 51 and the second transistors 52 that are not connected to the selectable cutoff section 14 is in an ON state, a part of the current output from the current source circuit section 31 flows to the first differential transistor section 50$a$ or the second differential transistor section 50$b$.

Current Ia1, which is a part of the current Ia flowing through the transistor 31$a$ of the current source circuit section 31, flows to the first differential transistor section 50$a$. In the first embodiment, since the selectable cutoff section 14 connected in series to one first transistor 51 is in a conducting state, the current Ia1 flowing through the first differential transistor section 50$a$ branches and flows to two first transistors 51. Current Ib1, which is a part of the current Ib flowing through the transistor 31*b* of the current source circuit section 31, flows to the second differential transistor section 50*b*. In the first embodiment, the selectable cutoff section 14 connected in series to one second transistor 52 is in a cutoff state, so the current Ib1 flowing through the second differential transistor section 50*b* flows through one second transistor 52. The current Ia1 flowing through the first differential transistor section 50*a* and the current Ib1 flowing through the second differential transistor section 50*b* join together and flow from the current source 13 to ground GND. The sum of the current Ia1 and the current Ib1 is equal to the current flowed by the current source 13.

The current source circuit section 31 is a circuit that makes the currents flowing through the pair of transistors 31*a* and 31*b* equal in magnitude, so the current Ia flowing through the transistor 31*a* and the current Ib flowing through the transistor 31*b* are equal in magnitude.

In the first embodiment, the first transistor 51 and the second transistor 52 are N-channel type field effect transistors, so, the larger the voltage applied to the gate terminal, the larger the current that flows. Therefore, as shown in FIG. 2, when the first voltage V1 is higher than the second voltage V2, the magnitude of the current Ia1 flowing to the first differential transistor section 50*a* is larger than the current Ib1 flowing to the second differential transistor section 50*b*. In this case, the magnitude of the current Ia2 remaining after the current Ia1 branches in the first current path section 30*a* is smaller than the magnitude of the current Ib2 remaining after the current Ib1 branches in the second current path section 30*b*. The current Ia2 flows through the first current path section 30*a* toward the ground GND and attempts to flow to the transistor 33*a* of the first current mirror circuit section 33. The current Ib2 flows through the second current path section 30*b* toward the ground GND and attempts to flow to the transistor 33*b* of the first current mirror circuit section 33.

Here, the first current mirror circuit section 33 attempts to make the magnitude of the current flowing through the transistor 33*b* the same as the magnitude of the current flowing through the transistor 33*a*. Therefore, even if the current Ib2 flowing through the second current path section 30*b* attempts to flow through the transistor 33*b*, it can only flow up to the magnitude of the current flowing through the transistor 33*a* in the first current path section 30*a*. As a result, the voltage in the portion of the second current path section 30*b* upstream of the transistor 33*b* of the first current mirror circuit section 33 becomes higher than the voltage in the portion of the first current path section 30*a* upstream of the transistor 33*a* of the first current mirror circuit section 33. As a result, the voltage Vb applied to the gate terminal 42*g* of the fourth transistor 42 becomes higher than the voltage Va applied to the gate terminal 41*g* of the third transistor 41. As a result, the voltage Va becomes relatively lower than the voltage Vb.

On the other hand, as shown in FIG. 3, when the first voltage V1 is lower than the second voltage V2, the magnitude of the current Ia1 flowing to the first differential transistor section 50*a* becomes smaller than the current Ib1 flowing to the second differential transistor section 50*b*. In this case, the magnitude of the current Ia2 remaining after the current Ia1 branches in the first current path section 30*a* becomes larger than the magnitude of the current Ib2 remaining after the current Ib1 branches in the second current path section 30*b*. In this case, the current that can flow through the transistor 33*a* of the first current mirror circuit section 33 becomes larger, but since the current Ib2 flowing through the second current path section 30*b* is smaller than the current Ia2, the amount of current that can flow through the transistor 33*b* cannot be made to flow even if an attempt is made to do so. As a result, the voltage Vb becomes lower than the voltage Va.

The higher of voltages Va and Vb will be the power supply voltage VDD if the difference between the first voltage V1 and the second voltage V2 is sufficiently large. If the difference between the first voltage V1 and the second voltage V2 is small, there is a possibility that the higher of the voltages Va and Vb will not rise all the way up to the power supply voltage VDD and becomes a value lower than the power supply voltage VDD. Even in this case, the difference between voltages Va and Vb is greater than the difference between the first voltage V1 and the second voltage V2. This is because the drain current flowing through a MOSFET is proportional to the square of the gate voltage, and therefore the difference between the current Ia2 flowing through the first current path section 30*a* and the current Ib2 flowing through the second current path section 30*b* is greater than the difference between the first voltage V1 and the second voltage V2. In addition, the first transistor 51 and the second transistor 52 have a larger ratio W/L of the channel width W to the channel length L than the other transistors included in the semiconductor device 100, so that the drain current output for the applied gate voltage is larger than that of the other transistors. Therefore, the difference between the current Ia2 flowing through the first current path section 30*a* and the current Ib2 flowing through the second current path section 30*b* can be more preferably increased, and the difference between the voltages Va and Vb can be more preferably increased.

In the first embodiment, the third transistor 41 and the fourth transistor 42 are P-channel type field effect transistors, so that the lower the voltage applied to the gate terminals 41*g* and 42*g*, the easier it is for a current to flow through the third transistor 41 and the fourth transistor 42. Therefore, as shown in FIG. 2, when the voltage Va is lower than the voltage Vb, the current Ica flowing through the third transistor 41 is larger than the current Icb flowing through the fourth transistor 42. On the other hand, as shown in FIG. 3, when the voltage Vb is lower than the voltage Va, the current Icb flowing through the fourth transistor 42 is greater than the current Ica flowing through the third transistor 41. The currents Ica and Icb are currents branched off from the current Ic flowing from the current source 43. The sum of the magnitudes of the currents Ica and Icb is equal to the magnitude of the current Ic.

As shown in FIG. 2, when the current Ica is greater than the current Icb, the current that can flow through the transistor 44*b* of the second current mirror circuit section 44 also becomes greater in accordance with the current of the transistor 44*a* of the second current mirror circuit section 44, but the current Icb that flows from the fourth transistor 42 to the transistor 44*b* is smaller than the current that can flow through the transistor 44*b*. Therefore, the voltage on the upstream side of the transistor 44*b*, that is, the voltage of the drain terminal of the transistor 44*b*, becomes lower than the voltage of the drain terminal of the transistor 44*a*. When the current Ica flows through the third transistor 41, the voltage of the source terminal 41*s* of the third transistor 41 drops, and the voltage of the source terminal 42*s* of the fourth transistor 42 connected to the source terminal 41*s* also drops. The voltage Vb applied to the gate terminal 42*g* of the fourth transistor 42 is higher than the voltage Va applied to the gate terminal 41*g* of the third transistor 41, so that the fourth transistor 42 approaches the OFF state as the voltage of the source terminal 42*s* drops. When the fourth transistor 42 is thus turned off, the output terminal 45 is shorted to ground GND, and the output voltage OUT of the output terminal 45 becomes the voltage of ground GND, i.e., 0 V.

On the other hand, as shown in FIG. 3, when the current Icb is larger than the current Ica, only a portion of the current Icb can flow through the transistor 44*b* of the second current mirror circuit section 44, and the voltage between the fourth transistor 42 and the transistor 44*b*, i.e., the output voltage VOUT, rises. Since the difference between the voltages Va and Vb applied to the third transistor 41 and the fourth transistor 42 of the second amplifier circuit section 40 is larger than the difference between the first voltage V1 and the second voltage V2, the difference between the currents Ica and Icb is sufficiently large. As a result, the output voltage VOUT can be suitably raised to the power supply voltage VDD by the current Icb that cannot be fully passed through the transistor 44*b*.

Figure 4:
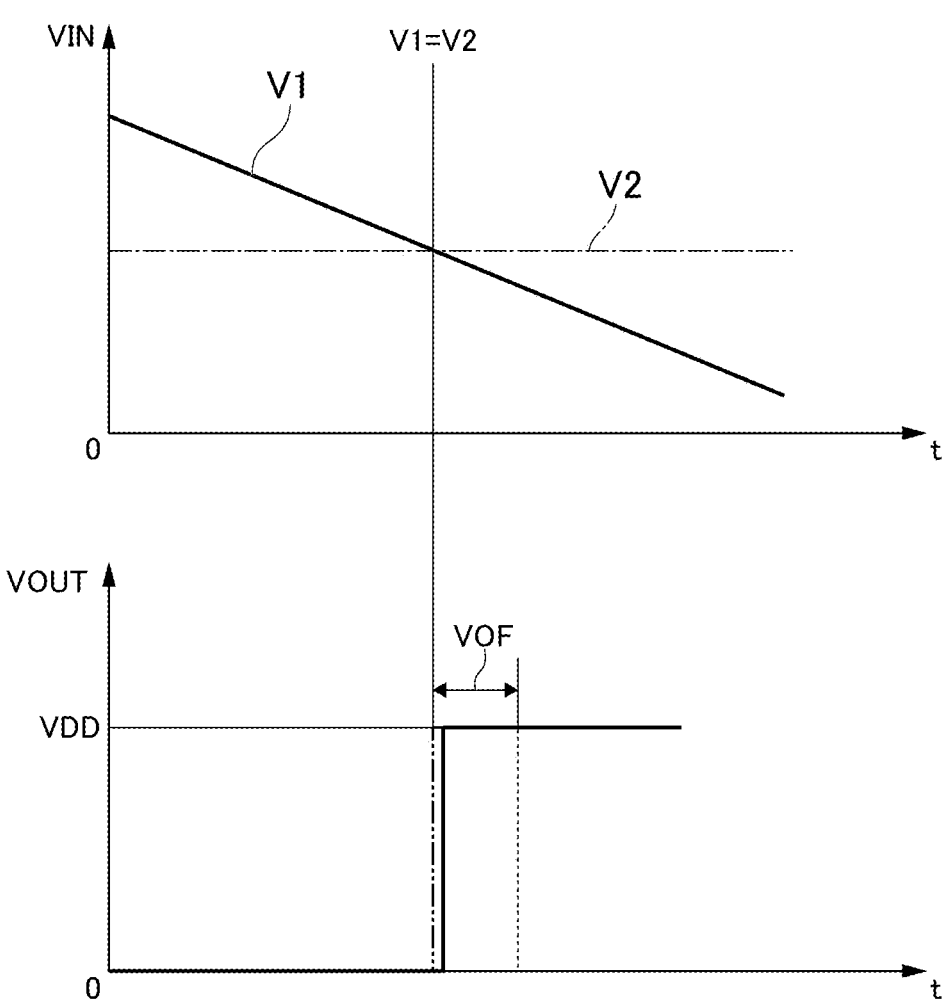
FIG. 4 is a graph showing the relationship between the input voltage and the output voltage in the first embodiment.

As described above, in the first embodiment, when the first voltage V1 is higher than the second voltage V2, 0V is output as the output voltage VOUT, and when the first voltage V1 is lower than the second voltage V2, the power supply voltage VDD is output as the output voltage VOUT. FIG. 4 is a graph showing the relationship between the input voltage VIN and the output voltage VOUT. The upper graph in FIG. 4 is a graph showing the first voltage V1 and the second voltage V2, which are the input voltage VIN. The lower graph in FIG. 4 is a graph showing the output voltage VOUT. FIG. 4 shows a case where the second voltage V2 is a constant voltage value, and the first voltage V1 is changed linearly with respect to time t from a voltage value higher than the second voltage V2 to a voltage value lower than the second voltage V2.

In the lower graph in FIG. 4, the two-dot chain line shows the change in the ideal output voltage VOUT. In the lower graph in FIG. 4, the dashed line shows the change in the conventional output voltage VOUT. In the graph at the bottom of FIG. 4, the solid line shows an example of the change in the output voltage VOUT in the first embodiment. As shown by the two-dot chain line in FIG. 4, ideally, when the first voltage V1 and the second voltage V2 are the same value, the output voltage VOUT should switch between 0V and the power supply voltage VDD. However, in reality, as shown by the dashed line in FIG. 4, due to the variation in impedance of each element, the point where the output voltage VOUT switches is shifted by the input offset voltage VOF from the point where the first voltage V1 and the second voltage V2 are the same value. In this case, in the region where the difference between the first voltage V1 and the second voltage V2 is small, it is possible that the output voltage VOUT will not be switched well.

In the semiconductor device 100 of the first embodiment, the input offset voltage VOF as described above occurs when there is a difference between the current Ia2 flowing to the first current mirror circuit section 33 in the first current path section 30*a* and the current Ib2 flowing to the first current mirror circuit section 33 in the second current path section 30*b*, even when the first voltage V1 and the second voltage V2 have the same voltage value. In response to this, for example, a current source that increases or decreases the currents Ia and Ib flowing from the pair of transistors 31*a* and 31*b* of the current source circuit section 31 may be provided separately to adjust the amount of each current. In this case, the input offset voltage VOF can be reduced by bringing the magnitude of the current Ia2 in the first current path section 30*a* and the magnitude of the current Ib2 in the second current path section 30*b* closer together using the separately provided current source. However, in this case, the total amount of current flowing in the first amplifier circuit section 30 changes, and the time required to charge the gate terminals 41*g*, 42*g* of the third transistor 41 and fourth transistor 42 in the second amplifier circuit section 40 changes. This changes the response time of the change in the output voltage VOUT to the change in the first voltage V1 and the second voltage V2, and there is a problem in that the responsiveness of the semiconductor device 100 changes.

In addition, for example, it is also possible to connect at least one of the pair of transistors 33*a*, 33*b* in the first current mirror circuit section 33 of the first amplifier circuit section 30 in parallel without providing a new current source and adjust the magnitude of the current Ia2 in the first current path section 30*a* and the magnitude of the current Ib2 in the second current path section 30*b*. However, in this case, the parasitic capacitance of the transistors provided in the first current mirror circuit section 33 increases, and the time required to charge the gates of the transistors in the first current mirror circuit section 33 changes. This causes a problem that the time when the voltages Va, Vb output to the third transistor 41 and the fourth transistor 42 change changes, and the responsiveness of the semiconductor device 100 changes.

To address the above problem, according to the first embodiment, the input circuit 10 is connected to the output circuit 20 that outputs the output voltage VOUT (output value) based on the first voltage V1 and the second voltage V2, and is an input circuit to which the first voltage V1 and the second voltage V2 are applied, and includes a first differential transistor section 50*a* having a plurality of first transistors 51 connected in parallel with each other, a second differential transistor section 50*b* having a plurality of second transistors 52 connected in parallel with each other, and a selectable cutoff section 14 that can select a state in which the current is cut off. The output circuit 20 has a first current path section 30*a* and a second current path section 30*b* that are arranged in parallel with each other between the power supply voltage wiring 60 to which the power supply voltage VDD is applied and the ground GND. The first differential transistor section 50*a* and the second differential transistor section 50*b* are arranged in parallel with each other between the power supply voltage wiring 60 and the ground GND. A first voltage V1 is applied to a gate terminal 51*g* (drive terminal) of the plurality of first transistors 51. A second voltage V2 is applied to a gate terminal 52*g* (drive terminal) of the plurality of second transistors 52. A drain terminal 51*d* (first terminal) of the plurality of first transistors 51 is connected to the first current path section 30*a*. A drain terminal 52*d* (first terminal) of the plurality of second transistors 52 is connected to the second current path section 30*b*. A source terminal 51*s* (second terminal) of the plurality of first transistors 51 and a source terminal 52*s* (second terminal) of the plurality of second transistors 52 are connected to each other. A selectable cutoff section 14 is connected in series to at least one of the plurality of first transistors 51 and the plurality of second transistors 52. The selectable cutoff section 14 is in either a conducting state in which a current is permitted to flow or a cutoff state in which a current is cut off. Therefore, by selecting either the conducting state or the cutoff state as the state of the selectable cutoff section 14, it is possible to adjust at least one of the ease of current flow in the first differential transistor section 50*a* and the ease of current flow in the second differential transistor section 50*b*.

Specifically, for example, when the above-mentioned two selectable cutoff sections 14 are both in a conducting state and the first voltage V1 and the second voltage V2 are set to the same voltage value, the total amount of current flowing in the second differential transistor section 50*b* is assumed to be greater than the total amount of current flowing in the first differential transistor section 50*a*. In this case, even if the first voltage V1 and the second voltage V2 are the same voltage value, a difference occurs between the current Ia2 flowing in the first current path section 30*a* and the current Ib2 flowing in the second current path section 30*b*, and an input offset voltage VOF is generated. In this case, when the selectable cutoff section 14 connected in series to one second transistor 52 is set to the cutoff state, no current flows through the one second transistor 52, and the total amount of current flowing through the second differential transistor section 50*b* is reduced compared to when the selectable cutoff section 14 is in the conductive state. This allows the total amount of current flowing through the second differential transistor section 50*b* to approach the total amount of current flowing through the first differential transistor section 50*a*. Therefore, the input offset voltage VOF can be reduced. Therefore, even if the difference between the first voltage V1 and the second voltage V2 is small, the semiconductor device 100 can be made to operate normally.

In addition, since the input offset voltage VOF can be reduced by adjusting the ease of current flow in the first differential transistor section 50*a* and the ease of current flow in the second differential transistor section 50*b*, changes in the total amount of current flowing through the first amplifier circuit section 30 can be suppressed. Furthermore, the parasitic capacitance in the first amplifier circuit section 30 does not change. Therefore, changes in the responsiveness of the semiconductor device 100 can be suppressed. As described above, according to the first embodiment, the input offset voltage VOF can be reduced while suppressing changes in the responsiveness of the semiconductor device 100.

In the output voltage VOUT in the first embodiment shown by the solid line in FIG. 4, a slight input offset voltage VOF remains, but this is not limited to this. The input offset voltage VOF may be completely trimmed by selecting the state of the selectable cutoff section 14.

The ratio W/L of the channel width W to the channel length L of the first transistor 51 to which the selectable cutoff section 14 is connected and the ratio W/L of the channel width W to the channel length L of the second transistor 52 to which the selectable cutoff section 14 is connected are determined, for example, based on the average value of the input offset voltage VOF that occurs when the selectable cutoff section 14 is not provided. For example, the ratio W/L of each transistor to which the selectable cutoff section 14 is connected is determined so that the input offset voltage VOF can be reduced to a predetermined range or less by changing the state of the selectable cutoff section 14 connected to at least one transistor. The predetermined range is not particularly limited.

According to the first embodiment, the selectable cutoff section 14 is connected in series to at least one first transistor 51. The selectable cutoff section 14 is connected in series to at least one second transistor 52. Therefore, in both the first differential transistor section 50*a* and the second differential transistor section 50*b*, the ease of current flow can be adjusted by selecting the state of the selectable cutoff section 14. This makes it easier to make the amount of current flowing through the first differential transistor section 50*a* and the amount of current flowing through the second differential transistor section 50*b* suitably close to each other. Therefore, the input offset voltage VOF can be further reduced.

According to the first embodiment, the selectable cutoff section 14 is a fuse. Therefore, the selectable cutoff section 14 can be provided at low cost. Furthermore, when changing the state of the selectable cutoff section 14 from a conducting state to a cutoff state, it is only necessary to blow the fuse, and it is easy to select the state of the selectable cutoff section 14.

According to the first embodiment, the output circuit 20 has a first amplifier circuit section 30 having a first current path section 30*a* and a second current path section 30*b*, and a second amplifier circuit section 40 connected to the first amplifier circuit section 30 and outputting an output voltage VOUT (output value). Therefore, the two amplifier circuit sections can suitably increase the difference between the first voltage V1 and the second voltage V2 and output it as the output voltage VOUT. In addition, the first amplifier circuit section 30 can increase the current generated based on the difference between the first voltage V1 and the second voltage V2 input to the input circuit 10. In other words, the current gain for the input of the first voltage V1 and the second voltage V2 can be increased. Therefore, the time required for the gate terminals 41*g*, 42*g* of the third transistor 41 and the fourth transistor 42 operated to generate the output voltage VOUT can be shortened. This improves the switching speed of the output voltage VOUT when the first voltage V1 and the second voltage V2 change. Therefore, the responsiveness of the semiconductor device 100 can be improved.

As described above, in the first embodiment, the input offset voltage VOF can be reduced by providing the selectable cutoff section 14, while suppressing a decrease in the responsiveness of the semiconductor device 100. Therefore, the input offset voltage VOF can be reduced while suppressing a change in the responsiveness of the semiconductor device 100, which is improved by providing two amplifier circuit sections, the first amplifier circuit section 30 and the second amplifier circuit section 40. In addition, since the difference between the input voltages VIN can be suitably amplified by the two amplifier circuit sections while reducing the input offset voltage VOF, the semiconductor device 100 can operate normally even if the difference between the input voltages VIN is small. Therefore, according to the first embodiment, the semiconductor device 100 has a high response and high sensitivity by providing the input circuit 10 with the selectable cutoff section 14 capable of trimming the input offset voltage VOF and configuring the output circuit 20 to have a two-stage amplifier circuit section.

Second Embodiment

The second embodiment differs from the first embodiment in the configuration of the input circuit 210. In the following description, the same configuration as the above-mentioned embodiment may be omitted by appropriately assigning the same reference numerals.

Figure 5:
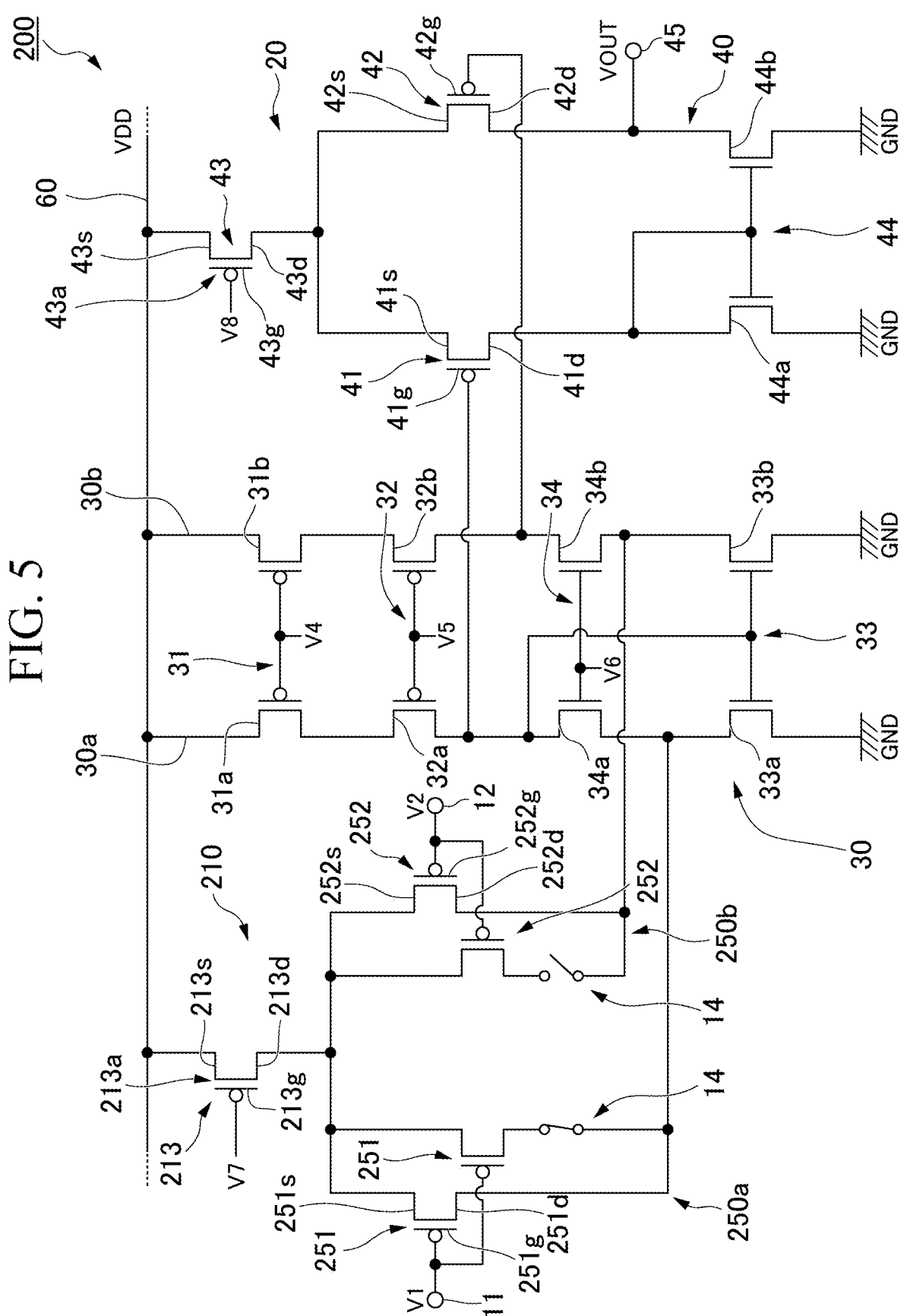
FIG. 5 is a circuit diagram showing a semiconductor device of a second embodiment.

FIG. 5 is a circuit diagram showing the semiconductor device 200 of the second embodiment. As shown in FIG. 5, in the input circuit 210, the current source 213 is composed of a transistor 213*a* which is a P-channel type MOSFET. The source terminal 213*s* of the transistor 213*a* is connected to the power supply voltage wiring 60. A predetermined voltage V7 is applied to the gate terminal 213*g* of the transistor 213*a*. The current source 213 is configured to pass a constant current based on the predetermined voltage V7. The predetermined voltage V7 may be a voltage having the same magnitude as the predetermined voltages V3, V4, V5, V6, and V8 described above, or may be a voltage having a magnitude different from the predetermined voltages V3, V4, V5, V6, and V8.

One end of the first differential transistor section 250a and one end of the second differential transistor section 250b are connected to the drain terminal 213d of the transistor 213a of the current source 213. The other end of the first differential transistor section 250a is connected to a portion of the first current path section 30a between the transistor 33a of the first current mirror circuit section 33 and the transistor 34a of the second auxiliary circuit section 34. The other end of the second differential transistor section 250b is connected to a portion of the second current path section 30b between the transistor 33b of the first current mirror circuit section 33 and the transistor 34b of the second auxiliary circuit section 34.

In the second embodiment, the first transistors 251 in the first differential transistor section 250a and the second transistors 252 in the second differential transistor section 250b are P-channel MOSFETs. A first voltage V1 is applied to the gate terminal 251g of the first transistors 251. A second voltage V2 is applied to the gate terminal 252g of the second transistors 252. The source terminals 251s of the first transistors 251 and the source terminals 252s of the second transistors 252 are connected to each other. The source terminals 251s of the first transistors 251 and the source terminals 252s of the second transistors 252 are connected to the drain terminal 213d of the transistor 213a of the current source 213. As in the first embodiment, a selectable cutoff section 14 is connected in series to each of the first transistors 251 and the second transistor 252.

The drain terminals 251d of the first transistors 251 are connected to the first current path section 30a. More specifically, the drain terminals 251d of the first transistors 251 are connected to a portion of the first current path section 30a between the transistor 33a of the first current mirror circuit section 33 and the transistor 34a of the second auxiliary circuit section 34. The drain terminal 251d of one of the first transistors 251 is connected to the first current path section 30a via the selectable cutoff section 14 in a conducting state.

The drain terminals 252d of the second transistors 252 are connected to the second current path section 30b. More specifically, the drain terminals 252d of the second transistors 252 are connected to a portion of the second current path section 30b between the transistor 33b of the first current mirror circuit section 33 and the transistor 34b of the second auxiliary circuit section 34. The drain terminal 252d of one second transistor 252 is connected to the second current path section 30b via the selectable cutoff section 14 in the cut-off state. Therefore, the drain terminal 252d of the one second transistor 252 and the second current path section 30b are cut off by the selectable cutoff section 14.

In the second embodiment, the drain terminal 251d of the first transistor 251 and the drain terminal 252d of the second transistor 252 correspond to the "first terminal". The source terminal 251s of the first transistor 251 and the source terminal 252s of the second transistor 252 correspond to the "second terminal".

In the second embodiment, the current output from the current source 213 flows split between the first differential transistor section 250a and the second differential transistor section 250b based on the difference between the first voltage V1 and the second voltage V2. The current flowing through the first differential transistor section 250a flows through the first current path section 30a and merges with the current output from the current source circuit section 31 to the first current path section 30a. The current flowing through the second differential transistor section 250b flows through the second current path section 30b and merges with the current output from the current source circuit section 31 to the second current path section 30b. In the second embodiment, the voltages Va and Vb applied to the second amplifier circuit section 40 change depending on the difference between the current flowing to the first current mirror circuit section 33 in the first current path section 30a and the current flowing to the first current mirror circuit section 33 in the second current path section 30b, and the output voltage VOUT changes.

The other configurations of the input circuit 210 are the same as the other configurations of the input circuit 10 in the first embodiment. The other configurations of the semiconductor device 200 are the same as the other configurations of the semiconductor device 100 in the first embodiment.

According to the second embodiment, as in the first embodiment described above, the selectable cutoff section 14 is provided in the input circuit 210, thereby reducing the input offset voltage VOF. Furthermore, even if the selectable cutoff section 14 is provided, the total amount of current flowing in the first amplifier circuit section 30 does not change, and the parasitic capacitance in the first amplifier circuit section 30 does not change, so that the change in the responsiveness of the semiconductor device 200 can be suppressed. Therefore, in the second embodiment, the input offset voltage VOF can be reduced while suppressing the change in the responsiveness of the semiconductor device 200.

Third Embodiment

The third embodiment differs from the first embodiment in the configuration of the output circuit 320. In the following description, the same components as those in the above-mentioned embodiments may be appropriately denoted by the same reference numerals and description may be omitted.

Figure 6:
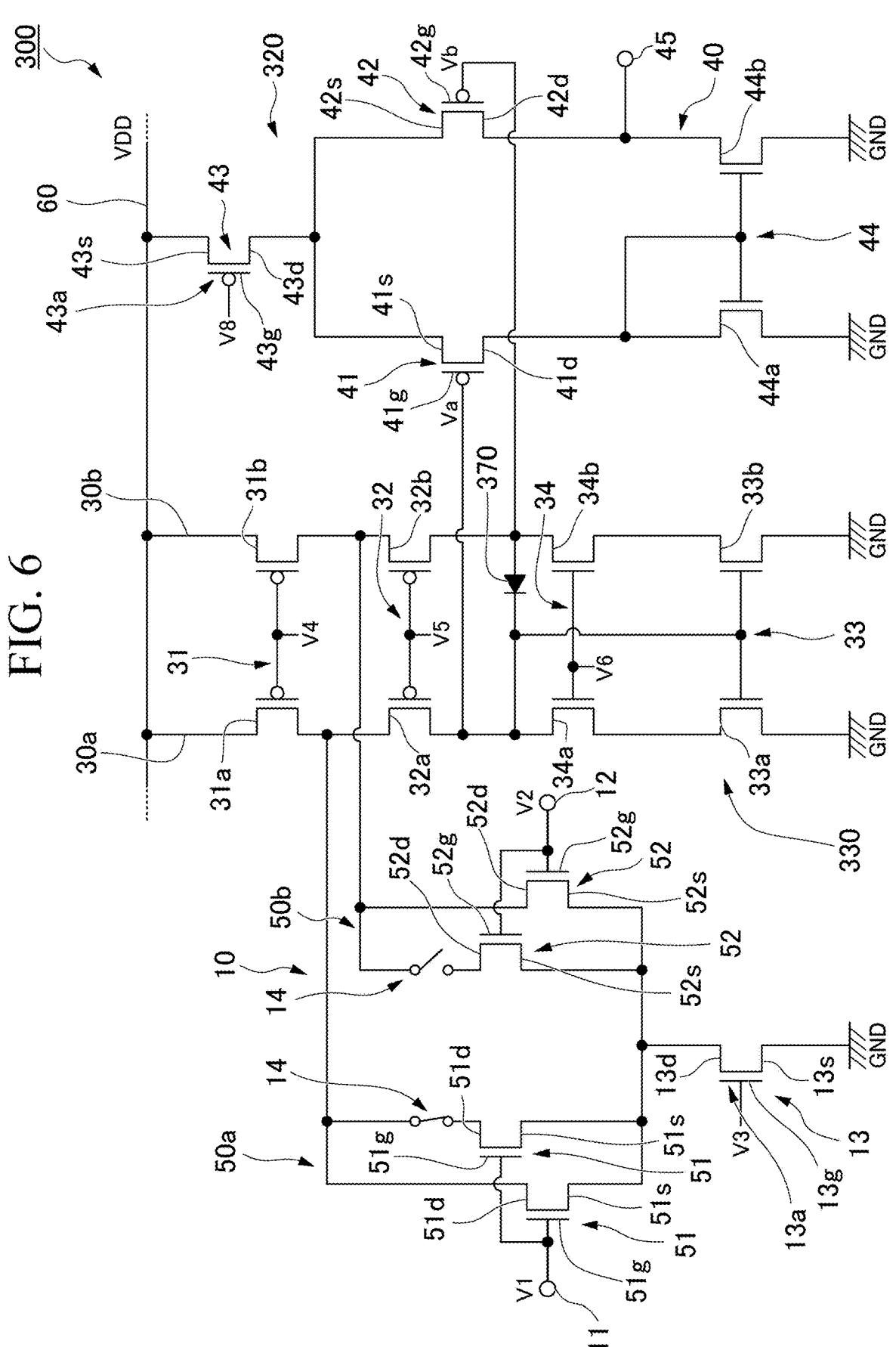
FIG. 6 is a circuit diagram showing a semiconductor device of a third embodiment.

FIG. 6 is a circuit diagram showing a semiconductor device 300 of the third embodiment. As shown in FIG. 6, in the output circuit 320 of the third embodiment, the first amplifier circuit section 330 has a diode 370. The anode of the diode 370 is connected to the portion of the second current path section 30b to which the gate terminal 42g of the fourth transistor 42 is connected. The anode of the diode 370 is connected to the drain terminal of the transistor 32b of the first auxiliary circuit section 32 and the drain terminal of the transistor 34b of the second auxiliary circuit section 34. The cathode of the diode 370 is connected to the portion of the first current path section 30a to which the gate terminal 41g of the third transistor 41 is connected. The cathode of the diode 370 is connected to the drain terminal of the transistor 32a of the first auxiliary circuit section 32, the drain terminal of the transistor 34a of the second auxiliary circuit section 34, and the gate terminals of the transistors 33a and 33b of the first current mirror circuit section 33.

Other configurations of the output circuit 320 are the same as those of the output circuit 20 in the first embodiment. Other configurations of the semiconductor device 300 are the same as those of the semiconductor device 100 in the first embodiment.

According to the third embodiment, the first amplifier circuit section 330 has a diode 370. The anode of the diode 370 is connected to a portion of the second current path section 30b to which the gate terminal 42g (drive terminal)

of the fourth transistor 42 is connected. The cathode of the diode 370 is connected to a portion of the first current path section 30*a* to which the gate terminal 41*g* (drive terminal) of the third transistor 41 is connected. Therefore, when the voltage Vb applied to the gate terminal 42*g* of the fourth transistor 42 becomes higher than the voltage Va applied to the gate terminal 41*g* of the third transistor 41, the difference between the voltages Va and Vb can be made the same as the forward voltage of the diode 370. As a result, for example, when the state in which the voltage Vb is higher than the voltage Va is switched to a state in which the voltage Vb is lower than the voltage Va, the amount of charge discharged until the voltage Vb becomes lower than the voltage Va can be reduced. Therefore, the time until the voltage Vb becomes lower than the voltage Va can be shortened compared to when the voltage Vb becomes the power supply voltage VDD. This further improves the responsiveness of the semiconductor device 300.

The anode of the diode 370 may be connected to the portion of the first current path section 30*a* to which the gate terminal 41*g* of the third transistor 41 is connected, and the cathode of the diode 370 may be connected to the portion of the second current path section 30*b* to which the gate terminal 42*g* of the fourth transistor 42 is connected. In this case, when the voltage Va applied to the gate terminal 41*g* of the third transistor 41 becomes higher than the voltage Vb applied to the gate terminal 42*g* of the fourth transistor 42, the difference between the voltage Va and the voltage Vb can be made the same as the forward voltage of the diode 370. As a result, when the voltage Va is switched from a state in which it is higher than the voltage Vb to a state in which it is lower than the voltage Vb, the speed at which charges are released from the gate terminal 41*g* of the third transistor 41 can be improved, and the responsiveness of the semiconductor device 300 can be improved.

Fourth Embodiment

The fourth embodiment differs from the first embodiment in the configuration of the input circuit 410. In the following description, the same configuration as in the above-mentioned embodiments may be omitted by appropriately assigning the same reference numerals.

Figure 7:
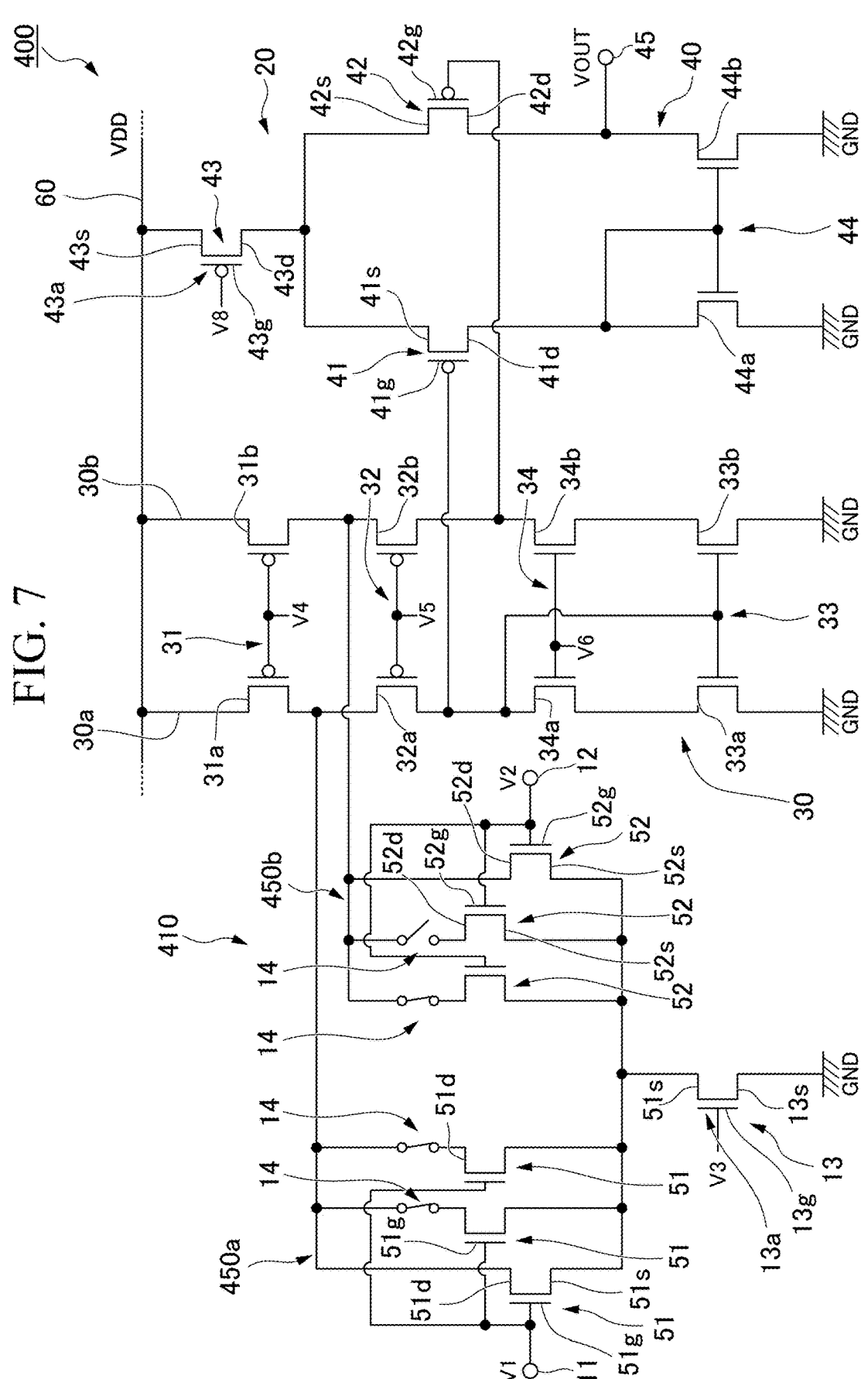
FIG. 7 is a circuit diagram showing a semiconductor device of a fourth embodiment.

FIG. 7 is a circuit diagram showing a semiconductor device 400 of the fourth embodiment. As shown in FIG. 7, in the input circuit 410 of the fourth embodiment, the first differential transistor section 450*a* has three first transistors 51. The second differential transistor section 450*b* has three second transistors 52. Of the three first transistors 51, two first transistors 51 are connected in series with selectable cutoff sections 14, respectively. Of the three second transistors 52, two second transistors 52 are connected in series with selectable cutoff sections 14, respectively. In the example of FIG. 7, both selectable cutoff sections 14 provided for the two first transistors 51 are in a conducting state, and one selectable cutoff section 14 provided for the two second transistors 52 is in a conducting state and the other is in a cutoff state.

The other configurations of the input circuit 410 are similar to the other configurations of the input circuit 10 in the first embodiment. The other configurations of the semiconductor device 400 are the same as those of the semiconductor device 100 in the first embodiment.

According to the fourth embodiment, the selectable cutoff sections 14 are connected in series to two or more first transistors 51, and the selectable cutoff sections 14 are connected in series to two or more second transistors 52.

Therefore, the state of the selectable cutoff sections 14 can be selected in each of the first differential transistor section 450*a* and the second differential transistor section 450*b*, and the ease of current flow in the first differential transistor section 450*a* and the ease of current flow in the second differential transistor section 450*b* can be adjusted more finely. Therefore, it is easier to reduce the input offset voltage VOF more suitably.

Fifth Embodiment

The fifth embodiment differs from the first embodiment in the configuration of the input circuit 510. In the following description, the same reference numerals may be appropriately used to omit the description of the same configuration as the above-mentioned embodiment.

Figure 8:
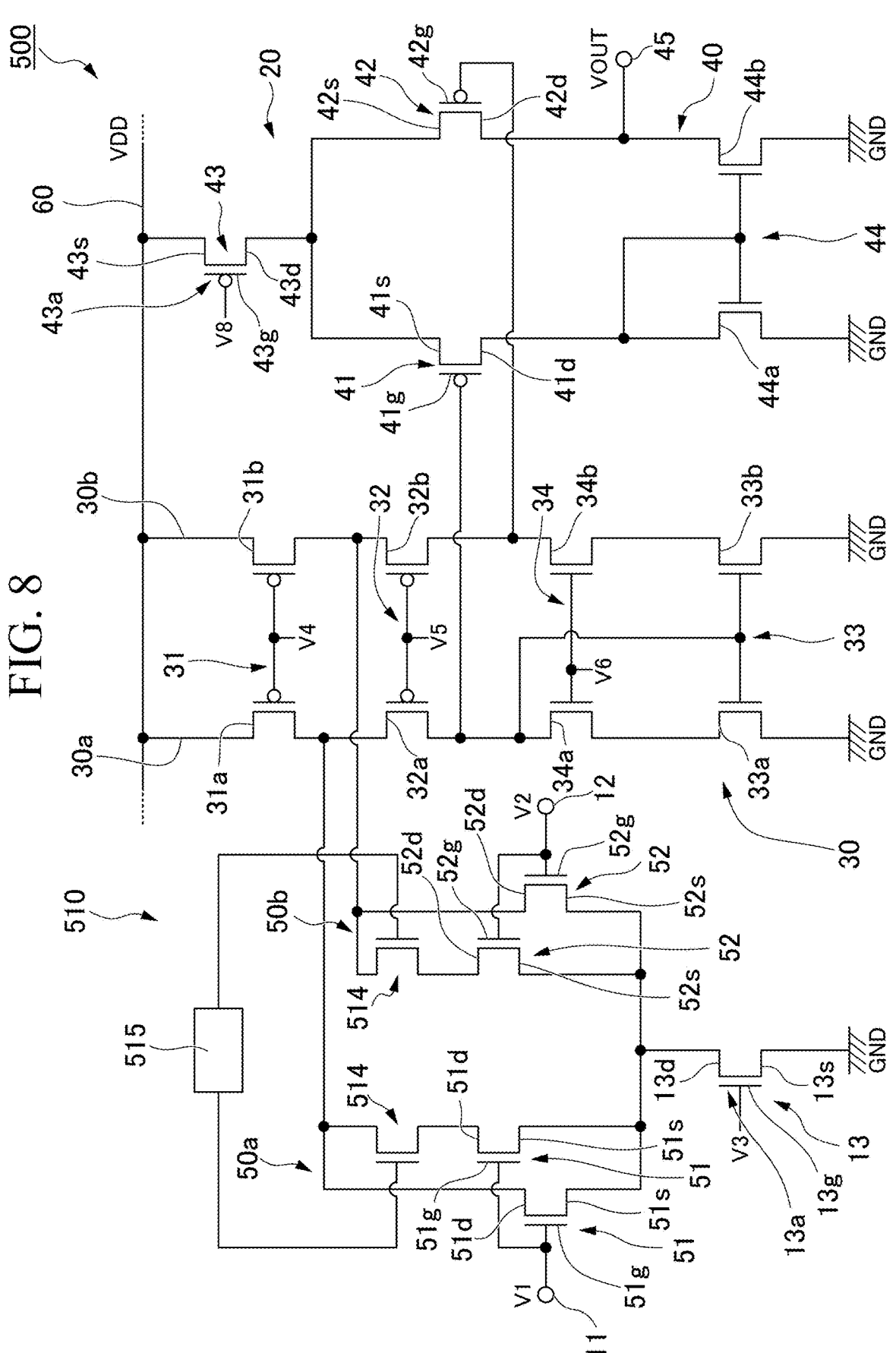
FIG. 8 is a circuit diagram showing a semiconductor device of a fifth embodiment.

FIG. 8 is a circuit diagram showing a semiconductor device 500 according to a fifth embodiment. As shown in FIG. 8, in the fifth embodiment, the selectable cutoff section 514 is a transistor. More specifically, the selectable cutoff section 514 is an N-channel MOSFET. The selectable cutoff section 514 is connected in series to, for example, one first transistor 51 and one second transistor 52.

The input circuit 510 has a control section 515. The control section 515 is connected to a gate terminal of the selectable cutoff section 514. The control section 515 applies a voltage to the gate terminal of the selectable cutoff section 514 to switch the state of the selectable cutoff section 514. When the selectable cutoff section 514, which is a transistor, is in an ON state, the selectable cutoff section 514 is in a conducting state. When the selectable cutoff section 514, which is a transistor, is in an OFF state, the selectable cutoff section 514 is in a cutoff state. The control section 515 stores information for determining whether the state of each selectable cutoff section 514 is to be a conducting state or a cutoff state. The control section 515 sets the state of each selectable cutoff section 514 to either a conducting state or a cutoff state based on the stored information. The information on the state of the selectable cutoff section 514 stored in the control section 515 may be updated as appropriate, for example, depending on the deterioration of the semiconductor device 500.

The other configurations of the input circuit 510 are the same as the other configurations of the input circuit 10 in the first embodiment. The other configurations of the semiconductor device 500 are the same as the other configurations of the semiconductor device 100 in the first embodiment.

According to the fifth embodiment, the selectable cutoff section 514 is a transistor. Therefore, by changing the voltage applied to the selectable cutoff section 514, it is possible to switch the state of the selectable cutoff section 514 between a conducting state and a cutoff state. As a result, even if the first transistor 51 and the second transistor 52 deteriorate and their characteristics with respect to the input voltage VIN change, causing the input offset voltage VOF to rise, the state of the selectable cutoff section 514 can be switched to reduce the input offset voltage VOF.

According to at least one of the embodiments described above, the input circuit is connected to an output circuit that outputs an output value based on a first voltage and a second voltage and is an input circuit to which the first voltage and the second voltage are applied. The input circuit has a first differential transistor section having a plurality of first transistors connected in parallel with each other, a second differential transistor section having a plurality of second transistors connected in parallel with each other, and a selectable cutoff section that can select a state in which the current is cut off. The output circuit has a first current path section and a second current path section that are arranged in parallel with each other between a power supply voltage wiring to which a power supply voltage is applied and ground. The first differential transistor section and the second differential transistor section are arranged in parallel with each other between a power supply voltage wiring and ground. A first voltage is applied to the drive terminals of the first transistors, a second voltage is applied to the drive terminals of the second transistors, and the first terminals of the first transistors are connected to a first current path section. The first terminals of the second transistors are connected to a second current path section, and the second terminals of the first transistors and the second terminals of the second transistors are connected to each other. A selectable cutoff section is connected in series to at least one of the first transistors and the second transistors. The selectable cutoff section selects one of a state in which a current is allowed to flow and a state in which the current is cut off. This makes it possible to reduce the input offset voltage while suppressing changes in the responsiveness of the semiconductor device.

The selectable cutoff section may have any configuration as long as it is a portion that can select one of a state in which a current is allowed to flow and a state in which the current is cut off. The selectable cutoff section may be a switch that can mechanically switch between states. When the selectable cutoff section is a transistor, the transistor may be any type of transistor. When a plurality of selectable cutoff sections are provided, the plurality of selectable cutoff sections may include selectable cutoff sections having different structures. The selectable cutoff sections may be connected in series to all of the first transistors included in the first differential transistor section. The selectable cutoff sections may be connected in series to all of the second transistors included in the second differential transistor section. The number of selectable cutoff sections provided in the first differential transistor section and the number of selectable cutoff sections provided in the second differential transistor section may be different from each other. If the selectable cutoff sections are connected in series to one or more first transistors, the selectable cutoff sections connected in series to the second transistors does not have to be provided. If the selectable cutoff sections are connected in series to one or more second transistors, the selectable cutoff sections connected in series to the first transistors do not have to be provided.

The plurality of first transistors may include first transistors having different ratios W/L of the channel width W to the channel length L. In this case, if the selectable cutoff section is connected to each of two or more first transistors, the ease of current flow in the first differential transistor section can be adjusted more finely by appropriately selecting which of the selectable cutoff sections connected to which first transistors having different ratios W/L should be changed. This also applies to the second differential transistor section having a plurality of second transistors. The plurality of first transistors may include first transistors having a ratio W/L different from that of the second transistor. The plurality of second transistors may include second transistors having a ratio W/L different from that of the first transistor.

Each of the transistors in the above-mentioned embodiment including the first to fourth transistors may be any type of transistor. Each of the transistors may be an N-channel type field effect transistor or a P-channel type field effect transistor. At least one of the transistors may be a bipolar transistor.

The output circuit may be a circuit having one amplifier circuit section. The output circuit may be a circuit having three or more amplifier circuit sections. The semiconductor device having an input circuit and an output circuit is not particularly limited as long as it is a device that outputs an output value based on a first voltage and a second voltage. The semiconductor device may be, for example, an operational amplifier.

The input circuit and the semiconductor device of the embodiment include the following supplementary aspects.

Appendix 1

An input circuit connected to an output circuit that outputs an output value based on a first voltage and a second voltage, to which the first voltage and the second voltage are applied, the input circuit comprising:

a first differential transistor section having a plurality of first transistors connected in parallel with each other;
   a second differential transistor section having a plurality of second transistors connected in parallel with each other; and
   a selectable cutoff section that can select a state in which a current is cut off,
   wherein the output circuit has a first current path section and a second current path section that are arranged in parallel with each other between a power supply voltage wiring to which a power supply voltage is applied and ground,
   the first differential transistor section and the second differential transistor section are arranged in parallel with each other between the power supply voltage wiring and the ground,
   the plurality of transistors are connected in parallel with each other between the power supply voltage wiring and the ground; An input circuit in which the first voltage is applied to a drive terminal of a first transistor, the second voltage is applied to drive terminals of the second transistors,
   first terminals of the first transistors are connected to the first current path section,
   first terminals of the second transistors are connected to the second current path section,
   second terminals of the first transistors and second terminals of the second transistors are connected to each other,
   at least one of the first transistors and the second transistors has the selectable cutoff section connected in series, and
   the selectable cutoff section selects one of a state in which a current is allowed to flow and a state in which a current is cut off.

Appendix 2

The input circuit according to appendix 1, wherein the selectable cutoff section is connected in series to at least one of the first transistors, and
   the selectable cutoff section is connected in series to at least one of the second transistors.

Appendix 3

The input circuit according to appendix 2, wherein the selectable cutoff section is connected in series to two or more of the first transistors, and the selectable cutoff section is connected in series to two or more of the second transistors.

Appendix 4

The input circuit according to any one of appendices 1 to 3, wherein the selectable cutoff section is a fuse.

Appendix 5

The input circuit according to any one of appendices 1 to 3, wherein the selectable cutoff section is a transistor.

Appendix 6

A semiconductor device comprising an input circuit according to any one of appendices 1 to 5, and an output circuit connected to the input circuit.

Appendix 7

The semiconductor device according to appendix 6, wherein the output circuit comprises a first amplifier circuit section having the first current path section and the second current path section, and a second amplifier circuit section connected to the first amplifier circuit section and outputting the output value.

Appendix 8

The second amplifier circuit section includes a third transistor having a drive terminal connected to the first current path section, and a fourth transistor having a drive terminal connected to the second current path section, and
the first amplifier circuit section includes a diode,
the anode of the diode is connected to one of the portion of the first current path section to which the drive terminal of the third transistor is connected and the portion of the second current path section to which the drive terminal of the fourth transistor is connected, and
the cathode of the diode is connected to the other of the portion of the first current path section to which the drive terminal of the third transistor is connected and the portion of the second current path section to which the drive terminal of the fourth transistor is connected.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. An input circuit connected to an output circuit that outputs an output value based on a first voltage and a second voltage, to which the first voltage and the second voltage are applied, the input circuit comprising:
a first differential transistor section including a plurality of first transistors connected in parallel with each other;
a second differential transistor section including a plurality of second transistors connected in parallel with each other; and a selectable cutoff section capable of selecting a state in which a current is cut off,
wherein the output circuit includes a first current path section and a second current path section arranged in parallel with each other between ground and a power supply voltage wiring to which a power supply voltage is applied,
the first differential transistor section and the second differential transistor section are arranged in parallel with each other between the ground and the power supply voltage wiring,
the first voltage is applied to a drive terminal of the plurality of first transistors,
the second voltage is applied to a drive terminal of the plurality of second transistors,
a first terminal of the plurality of first transistors is connected to the first current path section,
a first terminal of the plurality of second transistors is connected to the second current path section,
a second terminal of the plurality of first transistors and a second terminal of the plurality of second transistors are connected to each other,
the selectable cutoff section is connected in series to one of the plurality of first transistors or one of the plurality of second transistors,
the input circuit includes a plurality of selectable cutoff sections,
a first one of the plurality of selectable cutoff sections is connected in series to a corresponding one of the plurality of first transistors,
a second one of the plurality of selectable cutoff sections is connected in series to a corresponding one of the plurality of second transistors,
two or more of the plurality of selectable cutoff sections are connected in series to corresponding two or more of the plurality of first transistors, and
other two or more of the plurality of selectable cutoff sections are connected in series to corresponding two or more of the plurality of second transistors.
2. An input circuit connected to an output circuit that outputs an output value based on a first voltage and a second voltage, to which the first voltage and the second voltage are applied, the input circuit comprising:
a first differential transistor section including a plurality of first transistors connected in parallel with each other;
a second differential transistor section including a plurality of second transistors connected in parallel with each other; and
a selectable cutoff section capable of selecting a state in which a current is cut off,
wherein the output circuit includes a first current path section and a second current path section arranged in parallel with each other between ground and a power supply voltage wiring to which a power supply voltage is applied,
the first differential transistor section and the second differential transistor section are arranged in parallel with each other between the ground and the power supply voltage wiring,
the first voltage is applied to a drive terminal of the plurality of first transistors,
the second voltage is applied to a drive terminal of the plurality of second transistors,
a first terminal of the plurality of first transistors is connected to the first current path section,
a first terminal of the plurality of second transistors is connected to the second current path section, a second terminal of the plurality of first transistors and a second terminal of the plurality of second transistors are connected to each other, the selectable cutoff section is connected in series to one of the plurality of first transistors or one of the plurality of second transistors, and the selectable cutoff section is a fuse.

3. A semiconductor device, comprising:

an output circuit that outputs an output value based on a first voltage and a second voltage; and an input circuit to which the first voltage and the second voltage are applied being connected to the output circuit, wherein the input circuit includes a first differential transistor section having a plurality of first transistors connected in parallel with each other, a second differential transistor section having a plurality of second transistors connected in parallel with each other, and a selectable cutoff section capable of selecting a state in which a current is cut off, the output circuit has a first current path section and a second current path section arranged in parallel with each other between ground and a power supply voltage wiring to which a power supply voltage is applied, the first differential transistor section and the second differential transistor section are arranged in parallel with each other between the power supply voltage wiring and the ground, the first voltage is applied to each of drive terminals of the plurality of first transistors, the second voltage is applied to each of drive terminals of the plurality of second transistors, each of first terminals of the plurality of first transistors is connected to the first current path section, each of first terminals of the plurality of second transistors is connected to the second current path section, each of second terminals of the plurality of first transistors and each of second terminals of the plurality of second transistors are connected to each other, the selectable cutoff section is connected in series to one of the plurality of first transistors or one of the plurality of second transistors, and the output circuit includes:

a first amplifier circuit section having the first current path section and the second current path section, and a second amplifier circuit section connected to the first amplifier circuit section and outputting the output value.

4. The semiconductor device of claim 3, wherein the second amplifier circuit section includes a third transistor having a drive terminal connected to the first current path section, and a fourth transistor having a drive terminal connected to the second current path section, the first amplifier circuit section includes a diode, an anode of the diode is connected to one of a portion of the first current path section and a portion of the second current path section, and a cathode of the diode is connected to the other of the portion of the first current path section and the portion of the second current path section.

\* \* \* \* \*